Jan. 8, 1963 E. R. LUCKA ET AL 3,072,868

TWIN T FILTER

Filed Feb. 10, 1960 3 Sheets-Sheet 1

INVENTORS,
EUGENE R. LUCKA
AND
GLEN H. THOMAS
BY
Diggins & LeBlanc
ATTORNEYS

TWIN T FILTER

Filed Feb. 10, 1960 3 Sheets-Sheet 2

INVENTORS,
EUGENE R. LUCKA
AND
GLEN H. THOMAS
BY Diggins & LeBlanc
ATTORNEYS

Jan. 8, 1963 E. R. LUCKA ETAL 3,072,868

TWIN T FILTER

Filed Feb 10, 1960 3 Sheets-Sheet 3

INVENTORS,
EUGENE R. LUCKA
AND
GLEN H. THOMAS

BY Diggins & LeBlanc

ATTORNEYS

United States Patent Office 3,072,868

Patented Jan. 8, 1963

3,072,868
TWIN T FILTER

Eugene R. Lucka, Hilliard, and Glen H. Thomas, Columbus, Ohio, assignors to International Research and Development Corporation, Worthington, Ohio, a corporation of Ohio Filed Feb. 10, 1960, Ser. No. 7,951
6 Claims. (Cl. 333—75)

This invention relates to adjustable frequency filter networks and more particularly relates to an improved parallel or twin T notch type filter.

The parallel or twin T notch filter (fully described in "Electronics Engineering Manual," volume VII, McGraw-Hill, pages 242–245) has been frequently used in conjunction with either a tuned amplifier or an untuned flat response amplifier to provide a sharply tuned frequency selective or rejective network. See, for instance, United States Patents Nos. 2,354,141 and 2,372,419.

In the selective type circuit the amplifier has a flat gain frequency characteristic and a feedback signal is returned through the parallel T network to render the amplifier highly degenerative at all frequencies except the null or notch frequency. At this frequency no degenerative signal is returned and thus the amplifier operates at maximum gain. In rejective or attenuation type circuits a tuned amplifier feeds the notch filter which then feeds a degenerative feedback to the amplifier at all frequencies other than the frequencies to which the amplifier is tuned. This, of course, produces a sharply tuned attenuation network.

The parallel T network consists of a first T comprising serially connected capacitors and a grounded resistor while the second T comprises serially connected resistors and a grounded capacitor. In order to provide for variation in the notch or null frequency of the network the three resistors are customarily made variable and ganged to provide single control tuning. In order to provide quality performance the three ganged variable resistors must be of a precision heavy duty type and must be accurately matched to one another. In addition to this, a certain amount of alignment of the three ganged controls is necessary and produces an added labor cost.

According to the present invention it has now been found that under certain circumstances it is possible to provide a null or notch type parallel T filter wherein only one resistor need be varied in order to provide a variable notch frequency. This eliminates the cost of two high quality heavy duty variable resistors along with the labor cost which was previously involved in aligning and calibrating the common control for the prior type three resistor units.

It is accordingly a primary object of the present invention to provide an improved parallel T notch type filter.

It is another object of the invention to provide an improved parallel T notch type filter whose notch frequency is variable by means of variation of a single variable resistor.

It is another object of the invention to provide an improved parallel T notch type filter suitable for use in conjunction with an amplifier to provide variable frequency selectivity or attenuation.

It is still another object of the invention to provide an improved parallel T notch type filter of the foregoing type which may also be used with oscillators and other feedback type circuits wherein variable attenuation is utilized to provide a control function.

These and further objects and advantages of the invention will become more apparent upon reference to the following specification and claims and the appended drawings wherein:

Figure 3:
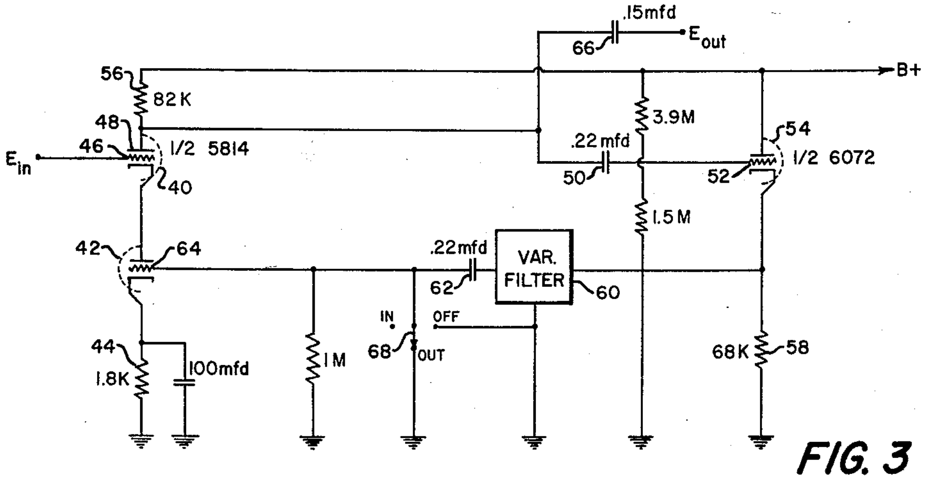
FIGURE 3 is a detailed circuit diagram of the circuit illustrated in simplified form in FIGURE 2.
Figure 5:
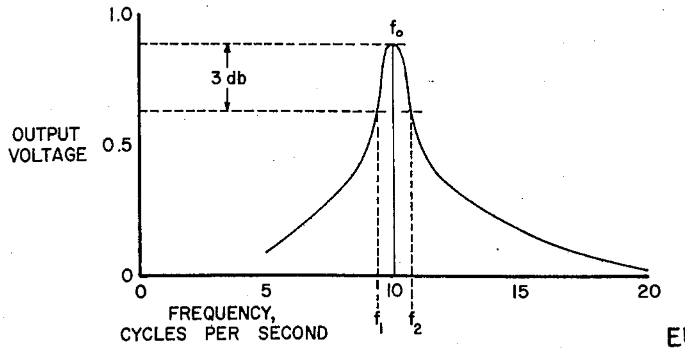
Figure 6:
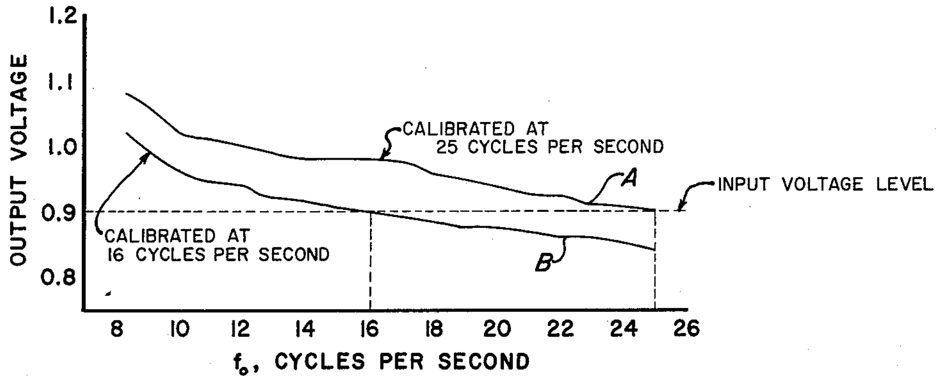
Figure 7:
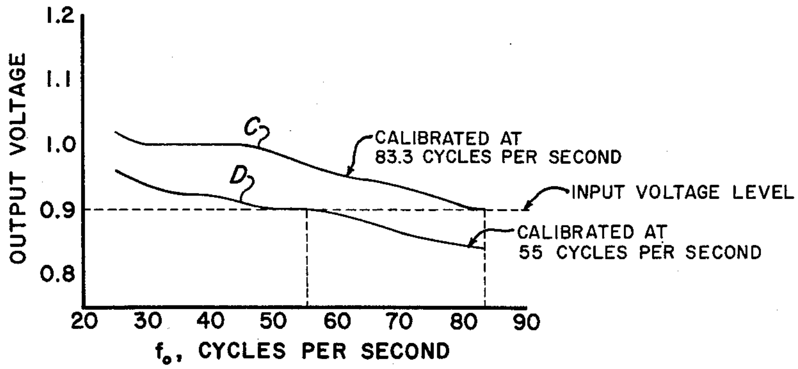
Figure 8:
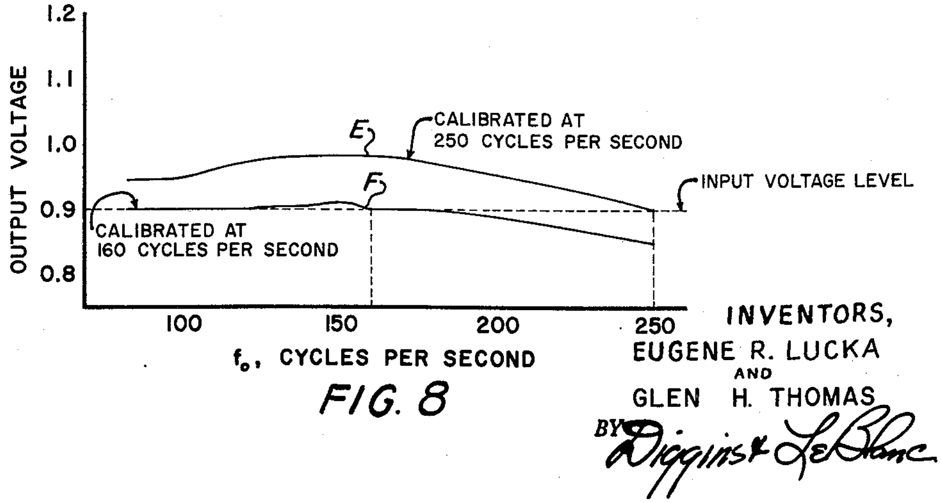

FIGURE 5 is a graph illustrating the frequency characteristic of a tuned network utilizing a parallel T notch filter constructed according to the invention; and FIGURES 6, 7 and 8 are graphs depicting the voltage output of the circuit of FIGURE 3 as a function of the frequency to which the parallel T notch filter is tuned for different frequency ranges of the unit and for different calibration frequencies.

Figure 4:
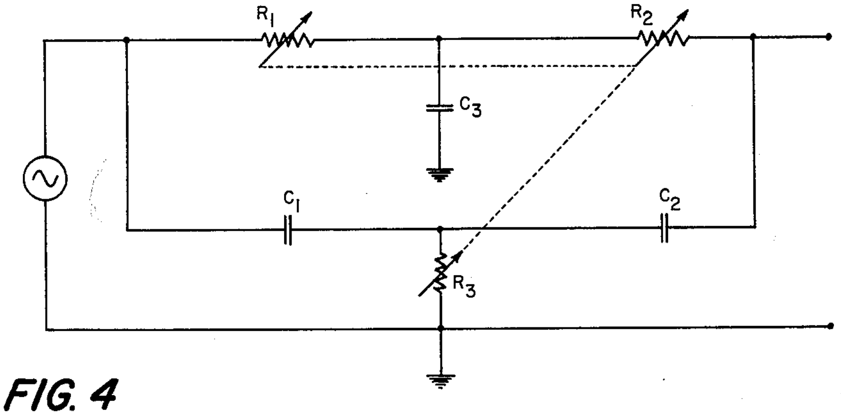
FIGURE 4 is a circuit diagram of a conventional parallel T notch filter having three variable resistors.

Referring to the figures of the drawings and more particularly to FIGURE 4, there is shown a conventional parallel or twin T notch filter having a resonant frequency:

$$f_0=1/(2\pi RC)$$

where $$R_1=R_2=2R_3=R$$
$$C_1=C_2=C_3/2=C$$

Figure 4A:
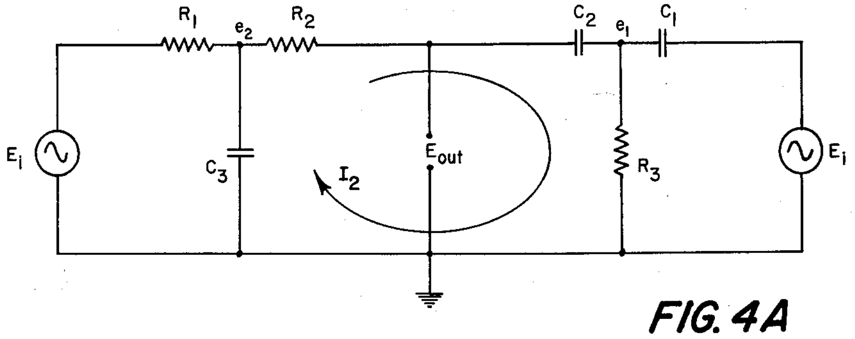
FIGURE 4A is a circuit diagram of the same parallel T notch filter of FIGURE 4 arranged differently to facilitate mathematical analysis.

For the purposes of the following analysis the circuit of FIGURE 4 is redrawn in FIGURE 4A wherein no specific relationship exists between the various values of the resistors and capacitances. Referring to FIGURE 4A a complete null is obtained when:

$$\omega_0=2\pi f_0;\ E_{out}=0$$

$R_3$ and $X_{c2}$ and $R_2$ and $X_{c3}$ are therefore effectively in parallel and the following relationships exist:

$$e_1=\frac{\frac{E_iR_3(-jX_{c_2})}{R_3-jX_{c_2}}}{\frac{R_3(-jX_{c_2})}{R_3-jX_{c_2}}-jX_{c_1}}=\frac{-jX_{c_2}R_3E_i}{-jX_{c_2}R_3-jX_{c_1}R_3-X_{c_1}X_{c_2}}$$

$$=jX_{c_2}I_2$$

and:

$$e_2=\frac{\frac{E_i(-jX_{c_3}R_2)}{R_2-jX_{c_3}}}{\frac{R_2(-jX_{c_3})}{R_2-jX_{c_3}}+R_1}=\frac{-jX_{c_3}R_2E_i}{-jX_{c_3}R_2-jX_{c_3}R_1+R_1R_2}=R_2I_2$$

$$\frac{e_1}{e_2}=\frac{jX_{c_2}}{R_2}=\frac{jX_{c_2}R_3(jX_{c_3}R_2+jX_{c_3}R_1-R_1R_2)}{jX_{c_3}R_2(jX_{c_2}R_3+jX_{c_1}R_3+X_{c_1}X_{c_2})}$$

combining and cross multiplying the above:

$$1=\frac{X_{c_2}X_{c_3}R_2^2R_3+X_{c_2}X_{c_3}R_1R_2R_3+jX_{c_2}R_1R_2^2R_3}{X_{c_1}X_{c_2}^2X_{c_3}R_2+j(X_{c_2}^2X_{c_3}R_2R_3+X_{c_1}X_{c_2}X_{c_3}R_2R_3)}$$

In order to satisfy the foregoing relationship the real terms in the numerator and denominator and the imaginary terms in the numerator and denominator must be equal as follows:

$$\therefore X_{c_2}R_1R_2^2R_3=X_{c_2}^2X_{c_3}R_2R_3+X_{c_1}X_{c_2}X_{c_3}R_2R_3$$

$$R_1R_2=X_{c_2}X_{c_3}+X_{c_1}X_{c_3}=\frac{1}{\omega_0^2C_2C_3}+\frac{1}{\omega_0^2C_1C_3}$$

$$\therefore \omega_0^2=\frac{C_1+C_2}{C_1C_2C_3R_1R_2}$$

also:

$$X_{c_1}X_{c_2}^2X_{c_3}R_2=X_{c_2}X_{c_3}R_2^2R_3+X_{c_2}X_{c_3}R_1R_2R_3$$

$$R_2R_3+R_1R_3=\frac{1}{\omega_0^2C_1C_2}$$

$$\therefore \omega_0^2=\frac{1}{C_1C_2(R_2R_3+R_1R_3)}$$

Equating the two expressions for $\omega_0^2$:

$$\frac{1}{C_1C_2(R_2R_3+R_1R_3)}=\frac{C_1+C_2}{C_1C_2C_3R_1R_2}$$

$$\frac{C_1+C_2}{C_3}=\frac{R_1R_2}{R_3(R_1+R_2)}$$

If fixed values of capacitors are used:

$$\frac{C_1+C_2}{C_3}=K$$

From the expression:

$$\frac{R_1R_2}{R_3(R_1+R_2)}=K$$

a fixed value of $R_3$ can be chosen and if $R_2$ is much greater than $R_1$; the expression $$\frac{R_1R_2}{R_1+R_2}$$

reduces to $R_1$ $$\therefore K=\frac{R_1}{R_3}$$

Thus, according to the discovery of this invention in order to obtain a variable filter it is only necessary to have one variable element so long as the foregoing conditions are met, that is:

$$\frac{C_1+C_2}{C_3}=\frac{R_1}{R_3}$$

where $R_2$ is the variable and is always considerably greater than $R_1$.

Equations may be derived from the foregoing relationships which will solve various R and C values over a given frequency range. One assumption may be made which greatly simplifies design.

Since:

$$\frac{C_1+C_2}{C_3}=\frac{R_1}{R_3}$$

Then if $C_2$ is considerably less than $C_1$, $C_1$ and $C_3$ can be equal and as a result $R_1$ and $R_3$ will be equal. A particular value of $C_2$ must be chosen to correspond to the other circuit values and this value can be obtained quite simply from the foregoing equations as is shown herewith:

$$C_2=\frac{1}{\omega_0^2C_1R_3(R_1+R_2)}$$

where $R_2$ is that value corresponding to a given $\omega_0$.

By simple substitution in the foregoing equations all of the circuit values can be determined over a given frequency range, the limit being the point at which the parallel combination of $R_1$ and $R_2$ no longer is practically constant or equal to $R_1$.

Figure 1:
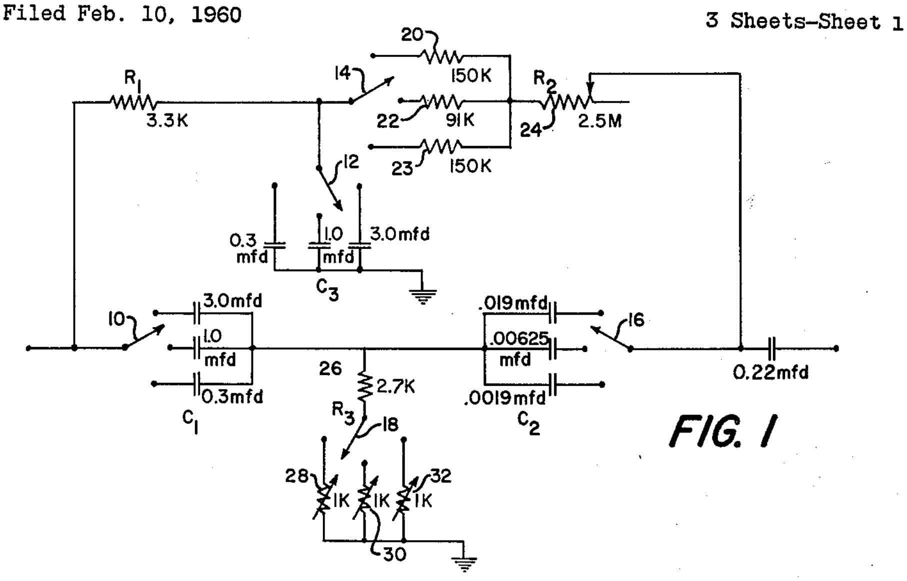
FIGURE 1 is a circuit diagram of a parallel T notch filter constructed according to one embodiment of the invention.

Referring to FIGURE 1 there is shown one specific example of a parallel T filter having circuit constants computed according to the foregoing relationships. This particular filter is designed to cover three frequency bands of 8.33–25 c.p.s., 25–83.3 c.p.s. and 83.33–250 c.p.s. In order to permit this, five, three position selector switches 10, 12, 14, 16 and 18 are utilized and are ganged to provide a single band selector control. Switch 10 selects any one of three capacitors which constitute $C_1$, while switch 12 selects any three capacitors which constitute $C_3$. Switch 14 selects either of three resistors 20, 22 and 23 which, in combination with resistor 24, constitute $R_2$. Switch 16 selects any one of three capacitors which constitute $C_2$. Switch 18 is connected between a resistor 26 and three resistors 28, 30 and 32 are variable in order to provide initial calibration of the unit. These resistors are not varied in normal tuning of the filter and thus need be neither of a heavy duty or precision type.

Figure 2:
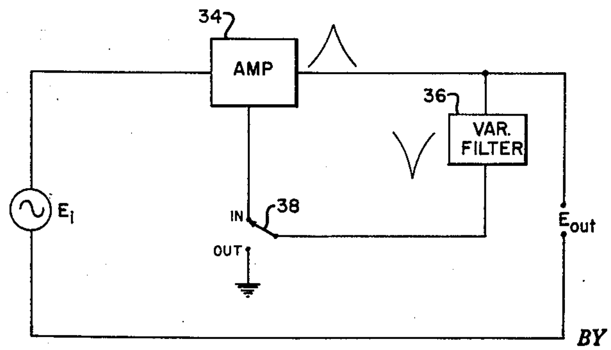
FIGURE 2 is a simplified circuit diagram showing the variable filter of FIGURE 1 utilized in conjunction with an amplifier having a flat gain frequency characteristic to provide a sharply selective variable frequency tuned network.

Referring to FIGURE 2 an amplifier 34 having a flat gain-frequency characteristic has a filter 36 of the type illustrated in FIGURE 1 connected to its output and to a switch 38. With switch 38 in the upper position, the variable filter 36 feeds a degenerative signal to the amplifier 34. With the switch 38 in the lower position, the variable filter 36 is grounded and has no effect on the response characteristic of the amplifier. A specific circuit which may be utilized in the arrangement of FIGURE 2 is illustrated in FIGURE 3.

Referring to FIGURE 3 a first triode amplifier 40 has a second triode 42 connected in its cathode circuit and returned to ground through a resistor 44. The triode 40 has the input voltage connected to its grid 46 and has its plate 48 connected through a coupling capacitor 50 to the grid 52 of a further triode 54. Plate 48 of triode 40 is connected through a plate resistor 56 to a supply of positive voltage, as is the plate of the triode 54. The cathode of triode 54 is returned to ground through a resistor 58 and the voltage across this resistor provides the input to the variable filter 60. The output of variable filter 60 is fed through coupling capacitor 62 to the grid 64 of triode 42 and this triode determines the gain of the triode amplifier 40. An output signal is taken direct from the plate 48 of triode 40 through a coupling capacitor 66. A switch 68 is provided at the output of the variable filter to permit grounding of the filter to enable the amplifier 40 to act simply as a broad response amplifier. Characteristic component values are shown in FIGURE 3 for one specific embodiment of the invention which may be used with the filter of FIGURE 1.

Utilizing the circuits of FIGURES 1 and 3 in conjunction with one another to form the arrangement of FIGURE 2 there is provided a sharply tuned selective network which is controlled by the single variable resistor 24 in FIGURE 1. In the unit illustrated in FIGURE 1 having three distinct operating bands of frequencies it is possible to calibrate the unit at the ends or at any given point in any individual frequency band. That is to say, in the frequency band 8.33 to 25 c.p.s. the unit may be adjusted by selecting one of the resistors 28, 30, 32 and adjusting its value so that the output voltage ($E_{out}$) at a predetermined frequency in the range is the same value in two situations: (1) when the filter is in the system and is tuned to the predetermined frequency; and (2) when the filter is disconnected from the system. In other words, at the predetermined frequency, the output voltage ($E_{out}$) is the same regardless of the position of the switch 38 (FIGURE 2). The predemined calibration frequency may be at the center of the band, e.g., 16 c.p.s., or at the high end of the band, e.g., 25 c.p.s., or at any other frequency in the band.

Under theoretically optimum conditions, this constancy of output voltage ($E_{out}$) would obtain for all frequencies within the pass band regardless of the position of the switch 38 (FIGURE 2) However, the optimum conditions are not achieved with the present filter or with the conventional parallel T network having three variable resistors. By utilizing the unit illustrated in FIGURES 1 through 3, it is found that when the filter is adjusted for the optimum conditions at the center of the operating band, the resulting error or departure from optimum conditions is within acceptable limits. Moreover at higher frequencies the resulting error decreases.

Referring to FIGURE 6, experimental results are illustrated in a graph depicting output voltage as a function of the frequency to which the filter is tuned. In the particular test which led to these results the input voltage was 0.9 which is indicated in the graph as the "Input Voltage Level." The upper curve A was obtained when the filter unit was adjusted for optimum performance at the upper end of the frequency band or at 25 c.p.s. The lower curve B illustrates the performance of the unit when the filter was adjusted for optimum performance at 16 c.p.s. FIGURE 7 provides similar curves C and D for the 25–83.3 c.p.s. band with the upper curve being calibrated for 83.3 c.p.s. and the lower curve calibrated for 55 c.p.s. Similarly, FIGURE 8 indicates performance of the unit in the band 83.33–250 c.p.s. with the upper curve E indicating performance with calibration at 250 c.p.s. and the lower curve F. indicating performance with calibration at 160 c.p.s.

Referring to FIGURE 5 there is shown another quality criteria of the unit. In this figure output voltage is plotted against frequency with the unit tuned to a fixed frequency $f_0$ here illustrated at 10 c.p.s. With Q defined as $$\frac{f_0}{f_2-f_1}$$

and computed at a level 3 decibels down on the response curve, the following values were obtained for the unit of FIGURES 1 through 3:

| Band, c.p.s. | Frequency, c.p.s. | Q |
|---|---|---|
| 8.33–25 | 8.5 | 13.0 |
| | 16 | 16 |
| | 25 | 13.9 |
| 25–83.3 | 25 | 12.5 |
| | 55 | 16.2 |
| | 80 | 13.6 |
| 83.3–250 | 85 | 12.5 |
| | 160 | 15.7 |
| | 250 | 13.8 |

It will be apparent from the foregoing that according to the present invention it is possible to provide a parallel T notch filter tuned by a single variable resistor and having performance characteristics of substantially the same quality as those with conventional units utilizing three variable resistors which are ganged. The unit of the invention may be produced at a lower parts cost and may be aligned with the use of less labor than was heretofore necessary with the older type three resistor units. While the filter has been illustrated in connection with an amplifier having a flat gain frequency characteristic to provide a selective network, it will be understood that is equally adapted to use with a selective amplifier to provide a variable frequency attenuation network or that it may also be used with various types of oscillators to provide a feedback function in a more economical manner.

The values of Q set forth in the foregoing table tend to vary somewhat over the frequency band but are significantly higher than the Q values which are observed with a conventional parallel T network. While the conventional parallel T network yields a more nearly constant Q value over any frequency band, nevertheless that nearly constant Q value is somewhat lower than the varying Q value obtained in the present filter.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. An electrical filter comprising a pair of symmetrical T networks connected in separate paths between a pair of common input terminals and a pair of common output terminals, one of said networks consisting of two series resistances and a shunt capacity, and the other of said networks consisting of two series capacities and a shunt resistance, said capacities and resistances being proportioned to provide maximum attenuation in the filter at a predetermined frequency, one of said series connected resistances connected to one of said output terminals being variable to provide variation in said predetermined frequency, the remaining series and shunt resistors being of a fixed value, said series connected capacities being connected to input and output terminals and respectively designated $C_1$ and $C_2$, said shunt capacity being designated $C_3$, said series connected resistors being connected to input and output terminals and respectively designated $R_1$ and $R_2$, $R_2$ being variable, said shunt resistor being designated $R_3$, $R_2$ being always considerably greater than $R_1$, and $$\frac{C_1+C_2}{C_3}=\frac{R_1}{R_3}$$

2. An electrical filter as set out in claim 1 wherein $C_2$ is considerably smaller than $C_1$, $C_1$ and $C_3$ are equal, and $R_1$ and $R_3$ are equal.

3. An electrical filter as set out in claim 2 wherein for any given predetermined frequency $$C_2=\frac{1}{\omega_0^2 C_1 R_3(R_1+R_2)}$$

4. An electrical filter comprising a pair of symmetrical T networks connected in separate paths between a pair of common input terminals and a pair of common output terminals, one of said networks consisting of two series resistances and a hunt capacity, and the other of said networks consisting of two series capacities and a shunt resistance, said series connected capacities being connected to input and output terminals and respectively designated $C_1$ and $C_2$, said shunt capacity being designated $C_3$, said series connected resistors being connected to input and output terminals and respectively designated $R_1$ and $R_2$, $R_2$ being variable, said shunt resistor being designated $R_3$, $R_2$ always being considerably greater than $R_1$ and $$\frac{C_1+C_2}{C_3}=\frac{R_1}{R_3}$$

5. An electrical filter as set out in claim 4 wherein $C_2$ is considerably smaller than $C_1$, $C_1$ and $C_3$ are equal, and $R_1$ and $R_3$ are equal.

6. An electrical filter as set out in claim 5 wherein for any given predetermined frequency $$C_2=\frac{1}{\omega_0^2 C_1 R_3(R_1+R_2)}$$

References Cited in the file of this patent

UNITED STATES PATENTS

| | | |
|---|---|---|
| 2,354,141 | Purington | July 18, 1944 |
| 2,465,265 | Ressler | Mar. 22, 1949 |
| 2,503,046 | Hills | Apr. 4, 1950 |

OTHER REFERENCES

Oono: Proceedings of the IRE, vol. 43, No. 5, May 1955, pages 617–619.